United States Patent
Többen et al.

(10) Patent No.: US 6,465,282 B1
(45) Date of Patent: Oct. 15, 2002

(54) METHOD OF FORMING A SELF-ALIGNED ANTIFUSE LINK

(75) Inventors: Dirk Többen, Dresden OT Langebrück; Axel Brintzinger; Stefan Weber, both of Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/966,332

(22) Filed: Sep. 28, 2001

(51) Int. Cl.[7] .................................................. H01L 21/82
(52) U.S. Cl. ........................................ 438/131; 257/50
(58) Field of Search ................................ 438/131, 688; 257/50, 530

(56) References Cited

U.S. PATENT DOCUMENTS

| | | | |
|---|---|---|---|
| 5,070,384 A | | 12/1991 | McCollum et al. |
| 5,110,754 A | | 5/1992 | Lowrey et al. |
| 5,350,710 A | * | 9/1994 | Hong et al. ................ 437/170 |
| 5,374,832 A | | 12/1994 | Tung et al. |
| 5,521,423 A | | 5/1996 | Shinriki et al. |
| 5,670,818 A | * | 9/1997 | Forouhi et al. ............ 257/530 |
| 5,780,323 A | * | 7/1998 | Forouhi et al. ............ 438/131 |
| 5,838,530 A | | 11/1998 | Zhang |

* cited by examiner

Primary Examiner—David Nelms
Assistant Examiner—Quoc Hoang
(74) Attorney, Agent, or Firm—Slater & Matsil, LLP

(57) ABSTRACT

An antifuse (e.g., 130) is formed in an integrated circuit through the use of a block mask (e.g., photoresist 120) during in situ antifuse dielectric formation. Generally, the mask allows self-aligned oxidation of an oxidizable metal (e.g., aluminum 104) to form the antifuse dielectric (e.g., aluminum oxide 124), while preventing oxidation of non-programmable or fixed connections (e.g., conductive stack 128). The number of mask, deposition, or etching steps may be reduced relative to prior art methods. In addition, a fixed connection may be formed during the formation of and at the same level as the antifuse link.

23 Claims, 4 Drawing Sheets

METHOD OF FORMING A SELF-ALIGNED ANTIFUSE LINK

TECHNICAL FIELD

The present invention relates generally to a method of forming an integrated circuit, and more particularly to a method of forming a self-aligned antifuse link in an integrated circuit.

BACKGROUND

Integrated circuits ("IC"s) are typically fabricated with all internal connections set during the manufacturing process. While ICs with predetermined functions reduce development and manufacturing tooling costs, users often desire ICs that are tailored to a specific application, and an IC with predetermined functions may not fit the specific requirements of the application. Manufacturers thus provide programmable ICs that can be programmed either by the manufacturer or by a user with the functionality needed for a specific application.

Programmable functions are available in a variety ICs, which can tailored for use in many different applications. Programmable logic devices ("PLD"s), programmable logic arrays ("PLA"s), field programmable gate arrays ("FPGA"s), programmable read only memories ("PROM"s), and some dynamic random access memories ("DRAM"s), are several examples of programmable devices.

Programmable ICs are typically programmed by either selectively breaking or creating programmable links in the IC. Programmable links are electrical interconnects which are broken or created at selected electronic nodes in the circuit by the user after the IC has been fabricated and packaged. Such programming is undertaken in order to activate or deactivate the selected electronic nodes in the IC so that the IC can perform a desired function.

Programmable links may be used for a variety of functions in an IC, such as implementing logic functions; selecting redundant cells, rows, columns or banks in a memory device; selecting various options and parameters in an IC, such as modes of operation, device ID and timing values; and fine tuning of component values, such as for resistors and capacitors.

Two well known types of programmable links are fusible links and antifuse links. A fusible link is manufactured as a short circuit, and is programmed by applying a sufficiently high voltage/current to the leads of the fuse to blow the fuse, creating an open circuit. In contrast, an antifuse is manufactured as an open circuit, and is programmed by applying a sufficiently high voltage to the leads of the antifuse to break down the antifuse, creating a short circuit or a relatively low resistance link.

Antifuse links typically consist of two conductor (including semiconductor) elements having some type of dielectric or insulating material between them. During programming, the dielectric at selected points between the conductive elements is broken down by a current developed by applying a predetermined programming voltage to the conductive elements of selected links to thereby electrically connect the conducting elements.

There are generally several problems, however, with prior art approaches to fabricating an antifuse link in an integrated circuit. For example, standard antifuse manufacturing generally requires the use of several mask, deposition or etching steps during or after the formation of the antifuse, thus increasing the fabrication complexity and cost of the IC. Generally, a thin nitride or oxide dielectric is deposited on a semiconductor substrate, and is then masked and patterned to form the dielectric of the antifuse. In some prior art methods, the antifuse dielectric formation itself may be self-aligned, but additional masking and patterning steps are needed to form non-programmable connections. In other self-aligned prior art methods, non-programmable connections may be oxidized during the antifuse dielectric formation, and additional masking and etching steps are needed to remove the oxide from the non-programmable connection surfaces.

SUMMARY OF THE INVENTION

These problems are generally solved or circumvented, and technical advantages are generally achieved, by a preferred embodiment of the invention in which a block mask is used during in situ antifuse dielectric formation. Generally, the mask allows self-aligned oxidation of the antifuse dielectric while preventing oxidation of non-programmable or fixed connections. The dielectric is preferably aluminum oxide.

In accordance with a preferred embodiment of the present invention, a method of forming a programmable integrated circuit comprises forming first and second conductive stacks on a substrate, wherein the first and second stacks comprise an oxidizable metal; masking the first conductive stack with a block mask; and oxidizing an exposed portion of the oxidizable metal in the second stack, wherein the second stack becomes non-conductive. The method further comprises removing the block mask from the substrate; forming a interlayer dielectric encasing the first conductive stack and the second non-conductive stack, wherein the interlayer dielectric comprises vias to the first conductive and the second non-conductive stacks; and forming a metallization layer filling the vias in the interlayer dielectric. The first conductive stack forms a fixed connection and the second non-conductive stack forms an antifuse link.

In accordance with another preferred embodiment of the present invention, a method of forming an antifuse link in a programmable integrated circuit comprises forming separate first and second sections of an oxidizable metal layer on a substrate; forming an interlayer dielectric encasing the first and second sections of the oxidizable layer; and forming first and second vias in the interlayer dielectric to the first and second sections, respectively, of the oxidizable metal. The method further comprises forming a block mask to isolate the first section of the oxidizable metal; oxidizing an exposed portion of the second section of the oxidizable metal; removing the block mask from the substrate; and filling the vias with a second metal. The first section of the oxidizable metal forms a fixed connection between the second metal and the substrate, and the oxidized portion of the second section forms an antifuse link between the second metal and the substrate.

In accordance with yet another preferred embodiment of the present invention, a method of forming a programmable integrated circuit comprises forming separate first and second sections of a first conductive layer on a substrate; forming first and second sections of an oxidizable metal on the first and second sections of the conductive layer, respectively; and forming first and second sections of a second conductive layer on first and second sections of the oxidizable metal, respectively. The method further comprises masking the first sections of the first conductive layer, the oxidizable metal and the second conductive layer with a block mask; removing a portion of the second section of the second conductive layer; and oxidizing an exposed portion of the second section of the oxidizable metal. The method further comprises removing the block mask from the substrate; forming a interlayer dielectric covering the substrate, wherein the interlayer dielectric comprises vias to the first section of the second conductive layer and to the oxidized portion of the oxidizable metal; and forming a metallization layer filling the vias in the interlayer dielectric.

An advantage of a preferred embodiment of the present invention is that the number of mask, deposition, or etching steps is reduced relative to prior art methods Another advantage of a preferred embodiment of the present invention is that the complexity and cost of the IC is reduced relative to prior art ICs.

Another advantage of a preferred embodiment of the present invention is that fixed connections may be formed during the formation of the antifuse links, and not before or after the antifuse links.

Another advantage of a preferred embodiment of the present invention is that fixed connections and antifuse links may be formed in the same vertical level on the substrate.

Another advantage of a preferred embodiment of the present invention is that fixed connections are masked by the block mask, and thus are not oxidized during the oxidation of the antifuse dielectric.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The making and use of the presently preferred embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention. The figures are drawn so as to clearly illustrate the relevant aspects of the preferred embodiments, and are not necessarily drawn to scale.

Preferred embodiments of the invention are described below in the context of a DRAM IC, but the invention may apply to any type of programmable IC. In addition, preferred embodiments of the invention are described below utilizing certain materials, such as aluminum oxide for the antifuse dielectric. It will be understood by those of ordinary skill in the art that other functionally similar integrated circuit materials may be substituted for the disclosed materials, and all such materials are within the scope of the present invention.

Figure 1A:
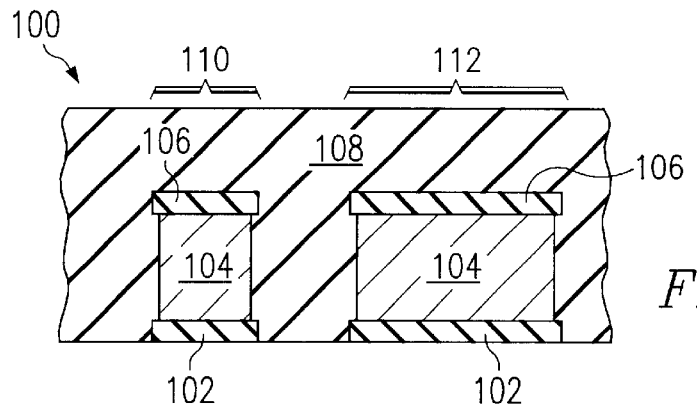
FIGS. 1A–1E are cross-sectional views of an integrated circuit structure in accordance with a first preferred embodiment of the present invention at various stages of fabrication.

FIGS. 1A–1E illustrate a first preferred embodiment for fabricating an aluminum oxide antifuse link Referring to FIG. 1A, there is shown a typical intermediate structure 100 on a DRAM IC, in which a number of layers are shown already formed in accordance with well known semiconductor processes. Deposition processes include direct sputtering, reactive sputtering, and chemical vapor deposition. In situ processes include thermal oxidation, plasma oxidation, anodization, and implantation. Etching processes include wet etching and dry etching, such as ion etching, reactive ion etching ("RIE"), and reactive etching.

The intermediate structure is formed on a silicon substrate (not shown), which may comprise other layers and structures disposed between the substrate and structure 100.

A patterned conductive layer of titanium nitride 102 is disposed on the semiconductor. Overlying TiN layer 102 is a first patterned oxidizable metallization layer of aluminum 104. While aluminum is the preferred metal for the loxidizable metallization layer, it may alternatively comprise titanium, tungsten, copper, other metals that become insulating when oxidized, or combinations thereof. As yet another alternative, titanium nitride or doped polysilicon may be used for this layer. Overlying aluminum layer 104 is another patterned conductive layer of titanium nitride 106. Alternatively, the conductive layers 102 and 106 may comprise titanium, tungsten, copper, aluminum, other metals doped polysilicon, or combinations thereof.

An interlayer dielectric ("ILD") of silicon dioxide 20 108 is on the structure to encase layers 102, 104 and 106 as shown. Alternatively, the ILD may comprise a nitride or a low dielectric constant organic material, other low-k materials, or combinations thereof. Conductive stack 110 will be used to form a fixed electrical connection between the underlying substrate and an overlying layer.

Conductive stack 112 will be used to form a programmable antifuse link between the underlying substrate and an overlying layer.

Figure 1B:
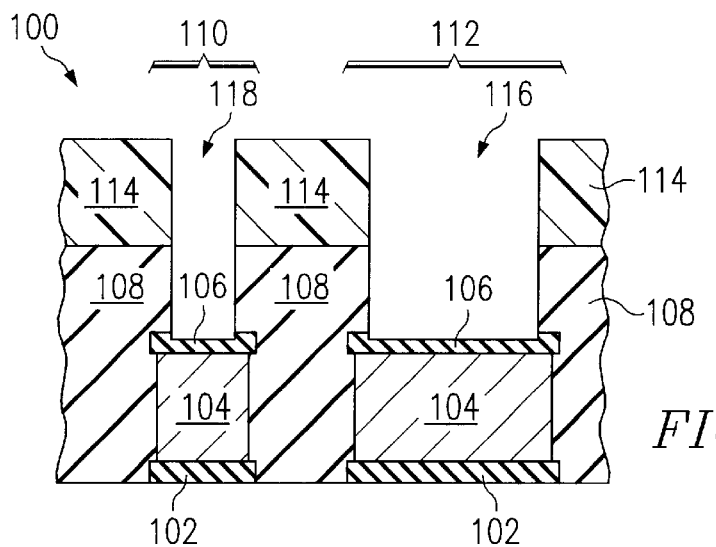

Referring now to FIG. 1B, a photoresist layer 114 is formed on silicon dioxide layer 108. A mask process is use,d to expose and develop photoresist 114 to remove portions in regions 116 and 118. Vias are then formed to both the fixed and programmable connections by etching silicon dioxide layer 108 in regions 116 and 118 with a RIE. The etch preferably stops either on or partially in titanium nitride layer 106.

Figure 1C:
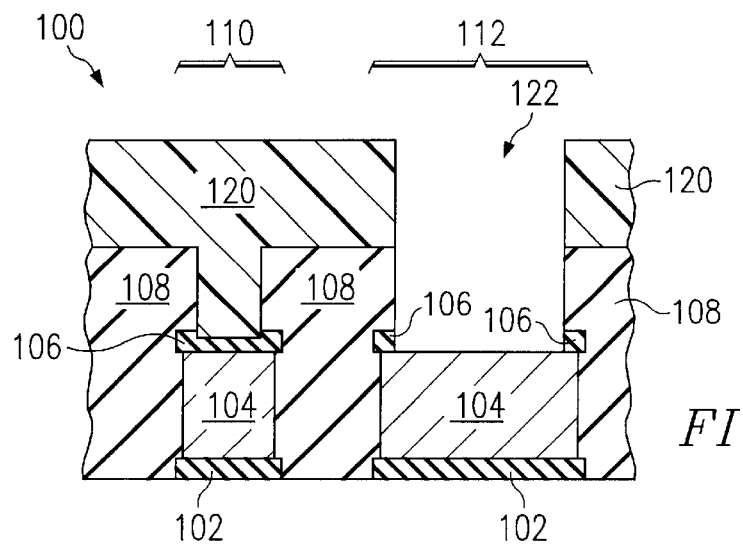

Referring now to FIG. 1C, photoresist 114 is stripped from the substrate, and a block mask 120 of photoresist is formed overlying the structure. Block mask 120 is patterned such that region 122 is removed to expose the top portion of stack 112, while stack 110 remains protected. Then a selective etch of the top conductive barrier layer TiN 106 is performed, exposing the upper surface of aluminum layer 104 in stack 112.

Figure 1D:
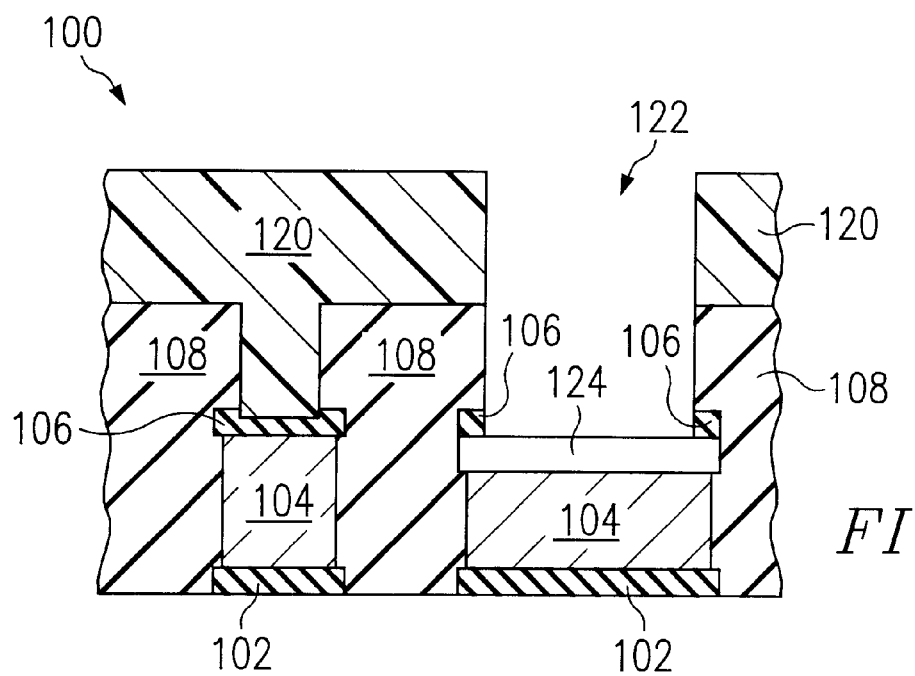

Referring to FIG. 1D, an upper potion of aluminum layer 104 is converted to aluminum oxide by ashing in an ozone atmosphere or oxygen plasma. Block mask 120 protects stack 110 from being exposed to the ashing process. Alternatively, block mask 120 may comprise another material that could function as a mask, such as a hard mask of silicon nitride. If ion etching is used, a wide variety of materials may be used for the block mask. If some type of reactive etching, such as RIE, is used, then the block mask material generally should have high etch selectivity with respect to, or be much thicker than, the materials being etched.

Figure 1E:
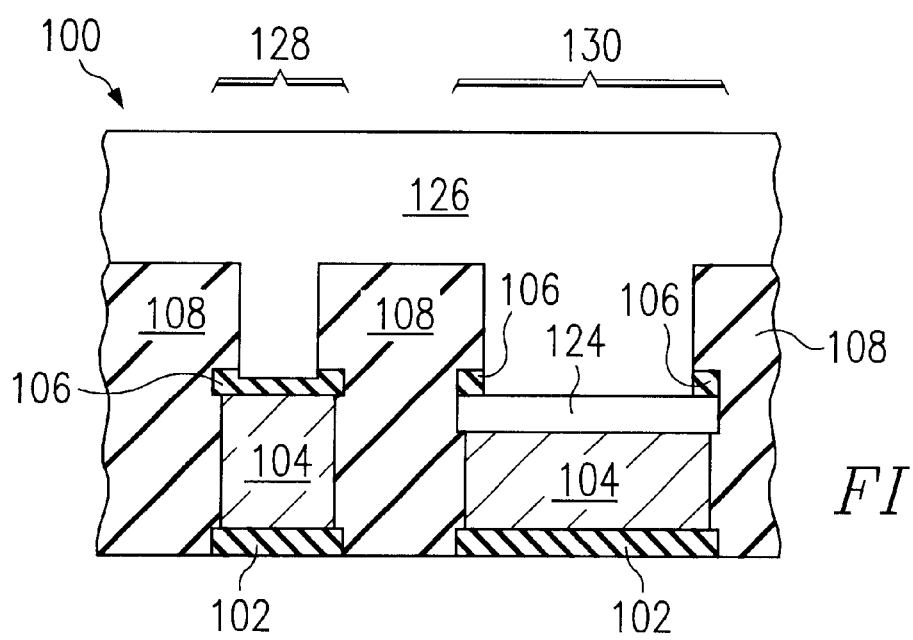

Referring to FIG. 1E, block mask 120 is stripped from the substrate, and a second metallization layer of aluminum 126 is formed on the surface of the substrate, filling in the vias. Alternatively, the second metallization layer may comprise other conductive materials such as titanium, tungsten, copper, titanium nitride, doped polysilicon or combinations thereof. Fixed conductive stack 128 provides a permanent connection between aluminum layer 126 and an underlying layer. Antifuse link 130 provides an open circuit to an underlying layer that can be programmed to be a low resistance connection to the underlying layer if desired.

One advantage of this embodiment is that the metal via fill (aluminum layer 126) may be performed immediately after the dielectric formation (aluminum oxide layer 124), thus providing a high integrity antifuse link. In addition, fixed connection 128 and antifuse link 130 may be formed during the same process steps and at the same vertical level on the substrate.

The remainder of the integrated circuit may be formed using conventional DRAM processing techniques. The resulting programmable DRAM may then be employed in a variety of commercial and consumer electronics devices, including computers.

Figure 2A:
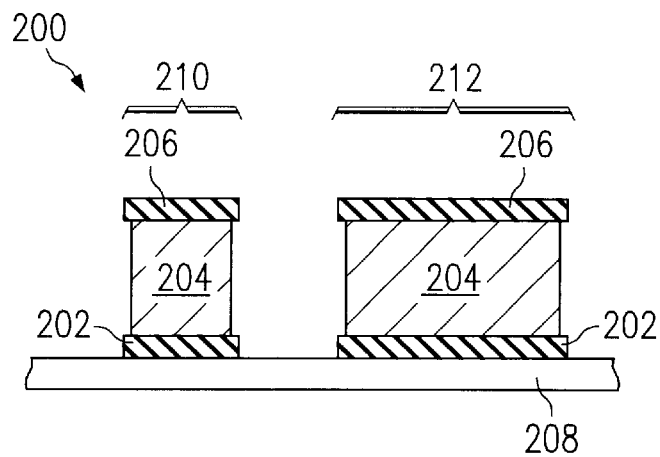
FIGS. 2A–2F are cross-sectional views of an integrated circuit structure in accordance with a second preferred embodiment of the present invention at various stages of fabrication.

FIGS. 2A–2F illustrate a second preferred embodiment antifuse link process flow. Referring to FIG. 2A, there is shown a typical intermediate structure 200 on a DRAM IC, in which a number of layers are shown already formed in accordance with well known semiconductor processes. Deposition processes include direct sputtering, reactive sputtering, and chemical vapor deposition. In situ processes include thermal oxidation, plasma oxidation, anodization, and implantation. Etching processes include wet etching and dry etching, such as ion etching, reactive ion etching ("RIE"), and reactive etching.

The intermediate structure is formed on silicon substrate 208, which may comprise other layers and structures disposed between it and the other layers shown in FIG. 2A.

A patterned conductive layer of titanium nitride 202 is disposed on the semiconductor. Overlying TiN layer 202 is a first patterned oxidizable metallization layer of aluminum 204. While aluminum is the preferred metal for the oxidizable metallization layer, it may alternatively comprise titanium, tungsten, copper, other metals that become insulating when oxidized, or combinations thereof. As yet another alternative, titanium nitride or doped polysilicon may be used for this layer. Overlying aluminum layer 204 is another patterned conductive layer of titanium nitride 206. Alternatively, the conductive layers 202 and 206 may comprise titanium, tungsten, copper, aluminum, other metals, doped polysilicon, or combinations thereof.

Conductive stack 210 will be used to form a fixed electrical connection between the underlying substrate 208 and an overlying layer. Conductive stack 212 will be used to form a programmable antifuse link between the underlying substrate 208 and an overlying layer.

Figure 2B:
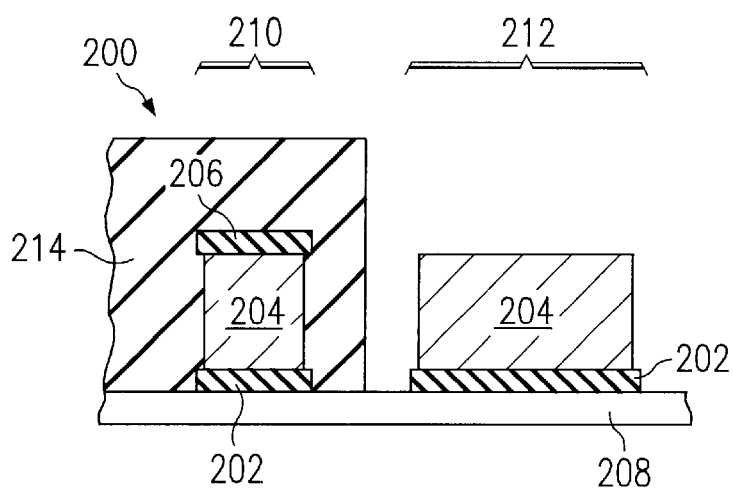

Referring now to FIG. 2B, a block mask 214 of photoresist is formed overlying the structure. Block mask 214 is patterned such that conductive stack 212 is exposed, while conductive stack 210 remains protected. Then a selective etch of the top conductive barrier layer TiN 206 is performed, exposing the upper surface, as well as the sides, of aluminum layer 204 in stack 212.

Figure 2C:
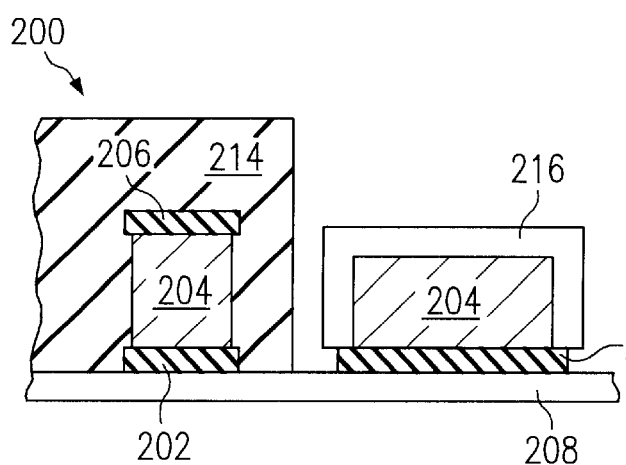

Referring to FIG. 2C, the exposed top surface and sides of aluminum layer 204 are converted to aluminum oxide by ashing in an ozone atmosphere or oxygen plasma. Block mask 214 protects stack 210 from being exposed to the ashing process.

Figure 2D:
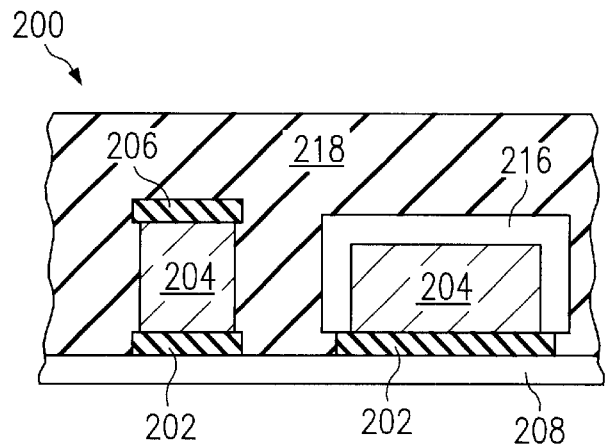

Referring to FIG. 2D, block mask 214 is stripped from the substrate, and an ILD of silicon dioxide 218 is formed on the structure to encase both stacks. Alternatively, the ILD may comprise a nitride or a low dielectric constant organic material, other low-k materials, or combinations thereof.

Figure 2E:
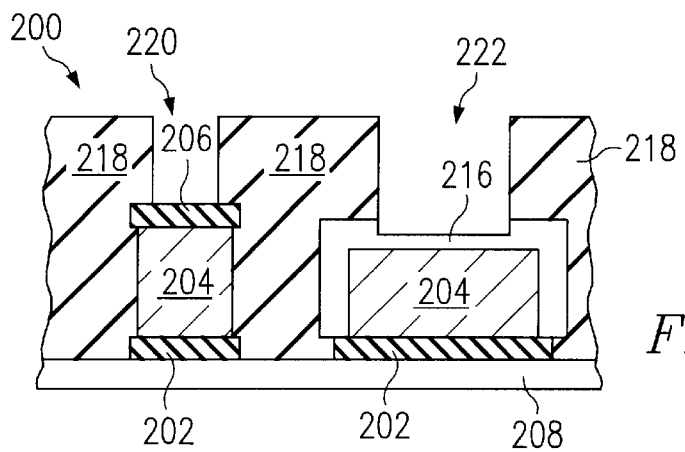

Referring to FIG. 2E, a photoresist layer (not shown) is formed on silicon dioxide layer 208. A mask process is used to expose and develop the photoresist layer, and then the underlying ILD 218 is etched to remove portions in regions 220 and 220, forming vias to both stacks. This step generally should be performed carefully so as not to etch through the thin antifuse dielectric underlying the ILD. For example, a process with high etch selectivity between the ILD and the antifuse dielectric may be used. The etch may stop at the surface of or partially in the antifuse dielectric layer. The photoresist is then stripped from the substrate.

Figure 2F:
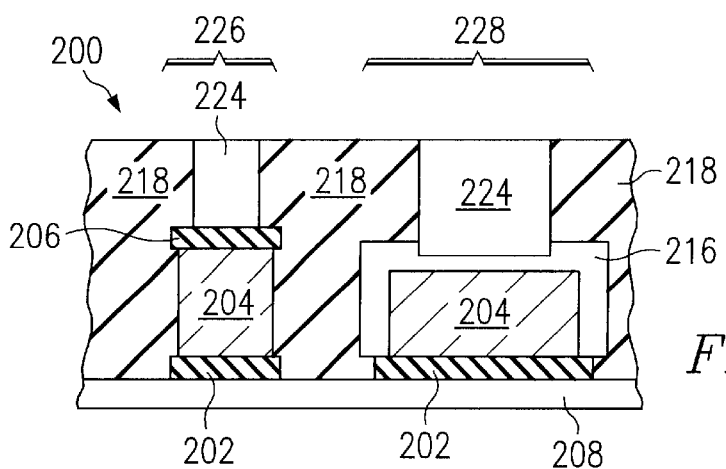

Referring to FIG. 2F, a second metallization layer of aluminum 224 is formed in the vias. Alternatively, the second metallization layer may comprise other conductive materials such as titanium, tungsten, copper, titanium nitride, doped polysilicon or combinations thereof. Fixed conductive stack 226 provides a permanent connection between aluminum layer 224 and an underlying layer., Antifuse link 228 provides an open circuit to an underlying layer that can be programmed to be a low resistance connection to the underlying layer if desired.

One advantage of this embodiment is that the exposed portions of oxidizable metallization layer (aluminum layer 204) may be completely encapsulated with a dielectric. In addition, fixed connection 226 and antifuse link 228 may be formed during the same process steps and at the same vertical level on the substrate.

The remainder of the integrated circuit may be formed using conventional DRAM processing techniques. The resulting programmable DRAM may then be employed in a variety of commercial and consumer electronics devices, including computers.

There are many alternative materials and processes which could be substituted for those disclosed in the above embodiments by one of ordinary skill in the art, and all such alternatives are considered to be within the scope of the present invention. For example, the specific etching, deposition, growth and masking processes used in each step of the preferred embodiments may be varied. As other examples, the specific materials used, and the dimensions of the layers and devices formed on the substrate, may also be varied. In addition, the order of process steps may be rearranged by one of ordinary skill in the art, yet still be within the scope of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a programmable integrated circuit comprising an antifuse link and a fixed connection, said method comprising:

forming first and second conductive stacks on a substrate, wherein said first and second stacks comprise an oxidizable metal;

masking said first conductive stack with a block mask;

oxidizing an exposed portion of said oxidizable metal in said second stack, wherein said second stack becomes non-conductive;

removing said block mask from said substrate;

forming a interlayer dielectric encasing said first conductive stack and said second non-conductive stack, wherein said interlayer dielectric comprises vias to said first conductive and said second non-conductive stacks; and forming a metallization layer filling said vias in said interlayer dielectric, wherein said first conductive stack forms said fixed connection and said second non-conductive stack forms said antifuse link.

2. The method of claim 1, wherein said forming said interlayer dielectric and said vias is performed before said forming said block mask and said oxidizing said oxidizable metal.

3. The method of claim 1, wherein said forming said interlayer dielectric and said vias is performed after said forming said block mask and said oxidizing said oxidizable metal.

4. The method of claim 1, wherein said forming each of said first and second conductive stacks further comprises:

forming a first conductive layer on said substrate, forming said oxidizable metal on said first conductive layer; and forming a second conductive layer on said oxidizable metal.

5. The method of claim 4, further comprising removing a portion of said second conductive layer in said second conductive stack prior to said oxidizing said exposed portion of said oxidizable metal.

6. The method of claim 4, wherein said first and second conductive layers are titanium nitride.

7. The method of claim 1, wherein said oxidizing said exposed portion of said oxidizable metal comprises ashing in an ozone atmosphere or oxygen plasma.

8. The method of claim 1, wherein said oxidizable metal is aluminum.

9. The method of claim 1, wherein said block mask is photoresist.

10. The method of claim 1, wherein said integrated circuit is a dynamic random access memory.

11. A method of forming an antifuse link in a programmable integrated circuit, the method comprising:

forming separate first and second sections of an oxidizable metal layer on a substrate;

forming an interlayer dielectric encasing said first and second sections of said oxidizable layer;

forming first and second vias in said interlayer dielectric to said first and second sections, respectively, of said oxidizable metal;

forming a block mask to isolate said first section of said oxidizable metal;

oxidizing an exposed portion of said second section of said oxidizable metal;

removing said block mask from said substrate; and filling said vias with a second metal; wherein said first section of said oxidizable metal forms a fixed connection between said second metal and said substrate, and wherein said oxidized portion of said second section forms an antifuse link between said second metal and said substrate.

12. The method of claim 11, wherein said forming said interlayer dielectric and forming said vias are performed before said forming said block mask and said oxidizing said oxidizable metal.

13. The method of claim 11, wherein said forming said interlayer dielectric and forming said vias are performed after said forming said block mask and said oxidizing said oxidizable metal.

14. The method of claim 11, wherein said oxidizing said oxidizable metal comprises ashing in an ozone atmosphere or oxygen plasma.

15. The method of claim 11, further comprising:

forming first and second section of a first conductive layer between said substrate and said first and second sections of said oxidizable metal, respectively; and forming first and second section of a second conductive layer overlying said first and second sections of said oxidizable metal, respectively.

16. The method of claim 15, further comprising removing a portion of said second section of said second conductive layer prior to said oxidizing said oxidizable metal.

17. The method of claim 15, wherein said first and second conductive layers are titanium nitride, said oxidizable metal is aluminum, and said block mask is photoresist.

18. A method of forming a programmable integrated circuit, said method comprising:

forming separate first and second sections of a first conductive layer on a substrate;

forming first and second sections of an oxidizable metal on said first and second sections of said conductive layer, respectively;

forming first and second sections of a second conductive layer on first and second sections of said oxidizable metal, respectively;

masking said first sections of said first conductive layer, said oxidizable metal and said second conductive layer with a block mask;

removing a portion of said second section of said second conductive layer;

oxidizing an exposed portion of said second section of said oxidizable metal;

removing said block mask from said substrate;

forming a interlayer dielectric covering said substrate, wherein said interlayer dielectric comprises vias to said first section of said second conductive layer and to said oxidized portion of said oxidizable metal; and forming a metallization layer filling said vias in said interlayer dielectric.

19. The method of claim 18, wherein said forming said interlayer dielectric and said vias is performed before said forming said block mask and said oxidizing said oxidizable metal.

20. The method of claim 18, wherein said forming said interlayer dielectric and said vias is performed after said forming said block mask and said oxidizing said oxidizable metal.

21. The method of claim 18, wherein said oxidizing said oxidizable metal comprises ashing in an ozone atmosphere or oxygen plasma.

22. The method of claim 18, wherein said first and second conductive layers are titanium nitride, said oxidizable metal is aluminum, and said block mask is photoresist.

23. The method of claim 18, wherein said integrated circuit is a dynamic random access memory.

* * * * *